(12) United States Patent
Chatterjee et al.

(10) Patent No.: US 7,652,305 B2
(45) Date of Patent: Jan. 26, 2010

(54) METHODS AND APPARATUS TO IMPROVE FRIT-SEALED GLASS PACKAGE

(75) Inventors: Dilip Kumar Chatterjee, Rochester, NY (US); Kelvin Nguyen, Rochester, NY (US)

(73) Assignee: Corning Incorporated, Corning, NY (US)

( * ) Notice: Subject to any disclaimer, the term of this patent is extended or adjusted under 35 U.S.C. 154(b) by 408 days.

(21) Appl. No.: 11/710,302

(22) Filed: Feb. 23, 2007

(65) Prior Publication Data

US 2008/0206925 A1    Aug. 28, 2008

(51) Int. Cl.
*H01L 33/00* (2010.01)
*H01L 31/0232* (2006.01)

(52) U.S. Cl. .............. 257/99; 257/40; 257/88; 257/432; 257/680; 257/E25.032

(58) Field of Classification Search .......... 257/99, 257/40, 88, 432, 680, E25.032
See application file for complete search history.

(56) References Cited

U.S. PATENT DOCUMENTS

| | | | |
|---|---|---|---|
| 6,565,400 B1 | 5/2003 | Lee et al. ............... 445/25 |
| 6,998,776 B2 | 2/2006 | Aitken et al. ............. 313/512 |
| 7,498,186 B2 * | 3/2009 | Lee ............................ 438/28 |
| 2002/0125484 A1 * | 9/2002 | Silvernail et al. ........... 257/79 |
| 2002/0179986 A1 * | 12/2002 | Orcutt et al. .............. 257/417 |
| 2004/0206953 A1 * | 10/2004 | Morena et al. ............. 257/40 |
| 2004/0232535 A1 * | 11/2004 | Tarn ......................... 257/680 |
| 2004/0238600 A1 * | 12/2004 | Tarn ....................... 228/124.6 |
| 2005/0157374 A1 * | 7/2005 | Tarn ......................... 359/291 |
| 2005/0248270 A1 | 11/2005 | Ghosh et al. ............... 313/512 |
| 2007/0023851 A1 * | 2/2007 | Hartzell et al. ............. 257/414 |
| 2007/0080362 A1 * | 4/2007 | Scotch et al. ............... 257/99 |
| 2007/0090759 A1 | 4/2007 | Choi et al. .................. 313/512 |
| 2007/0096631 A1 | 5/2007 | Sung et al. .................. 313/498 |
| 2007/0114909 A1 | 5/2007 | Park et al. ................... 313/495 |
| 2007/0170324 A1 | 7/2007 | Lee et al. .................... 248/247 |
| 2007/0170423 A1 | 7/2007 | Choi et al. .................. 257/40 |
| 2007/0170455 A1 | 7/2007 | Choi et al. .................. 257/100 |
| 2007/0170605 A1 | 7/2007 | Lee et al. .................... 264/1.1 |
| 2007/0170839 A1 | 7/2007 | Choi et al. .................. 313/500 |
| 2007/0170845 A1 | 7/2007 | Choi et al. .................. 313/504 |
| 2007/0170846 A1 | 7/2007 | Choi et al. .................. 313/504 |
| 2007/0170849 A1 | 7/2007 | Park ........................... 313/506 |
| 2007/0170850 A1 | 7/2007 | Choi et al. .................. 313/506 |
| 2007/0170854 A1 | 7/2007 | Kwak ......................... 313/512 |
| 2007/0170855 A1 | 7/2007 | Choi et al. .................. 313/512 |
| 2007/0170856 A1 | 7/2007 | Cha ............................ 313/512 |
| 2007/0170859 A1 | 7/2007 | Choi et al. .................. 313/512 |
| 2007/0170860 A1 | 7/2007 | Choi et al. .................. 313/512 |

(Continued)

FOREIGN PATENT DOCUMENTS

EP     1818997     8/2007

*Primary Examiner*—Nitin Parekh
(74) *Attorney, Agent, or Firm*—Bruce P. Watson

(57) ABSTRACT

A hermetically sealed package includes: a first plate including inside and outside surfaces; a second plate including inside and outside surfaces; frit material disposed on the inside surface of the second plate; and at least one dielectric layer disposed directly or indirectly on at least one of: (i) the inside surface of the first plate at least opposite to the frit material, and (ii) the inside surface of the second plate at least directly or indirectly on the frit material, wherein the frit material forms a hermetic seal against the dielectric layer in response to heating.

19 Claims, 4 Drawing Sheets

U.S. PATENT DOCUMENTS

| | | | |
|---|---|---|---|
| 2007/0170861 A1 | 7/2007 | Lee et al. | 313/512 |
| 2007/0171637 A1 | 7/2007 | Choi | 362/227 |
| 2007/0173167 A1 | 7/2007 | Choi | 445/25 |
| 2007/0717637 | 7/2007 | Choi | 362/227 |
| 2007/0176171 A1* | 8/2007 | Kim et al. | 257/40 |
| 2007/0194303 A1* | 8/2007 | Harada et al. | 257/40 |

\* cited by examiner

METHODS AND APPARATUS TO IMPROVE FRIT-SEALED GLASS PACKAGE

BACKGROUND OF THE INVENTION

The present invention is directed to hermetically sealed packages that are suitable to protect thin film devices, particularly those sensitive to the ambient environment. Some examples of such devices are organic emitting light diode (OLED) displays, sensors, and other optical devices. By way of example, the present invention will be discussed in the context of OLED displays, but is not limited to such.

OLEDs have been the subject of a considerable amount of research in recent years because of their use and potential use in a wide variety of electroluminescent devices. For instance, a single OLED can be used in a discrete light emitting device or an array of OLEDs can be used in lighting applications or flat-panel display applications (e.g., OLED displays). Traditional OLED displays are known to be very bright, to have a good color contrast, to produce true color, and to exhibit a wide viewing angle. However, traditional OLED displays, and in particular the electrodes and organic layers located therein, are susceptible to degradation resulting from interaction with oxygen and moisture leaking into the OLED display from the ambient environment. It is well known that the life of the OLED display can be significantly increased if the electrodes and organic layers within the OLED display are hermetically sealed from the ambient environment.

Unfortunately, it has been very difficult to develop a sealing process to hermetically seal the OLED display. Some of the factors that make it difficult to properly seal the OLED display include:

(i) that the hermetic seal should provide a barrier for oxygen ($10^{-3}$ cc/m$^2$/day) and water ($10^{-6}$ g/m$^2$/day);

(ii) that the size of the hermetic seal should be minimal (e.g., <2 mm) so it does not have an adverse effect on size of the OLED display;

(iii) that the temperature generated during the sealing process should not damage the materials (e.g., electrodes and organic layers) within the OLED display (e.g., the first pixels of OLEDs which are located about 1-2 mm from the seal in the OLED display should not be heated to more than 100° C. during the sealing process);

(iv) that the gases released during sealing process should not contaminate the materials within the OLED display; and (v) that the hermetic seal should enable electrical connections (e.g., thin-film chromium) to enter the OLED display.

Of the above challenges, one of the most difficult is the hermetic sealing due to the strong reactivity of organic molecules with oxygen and moisture.

Among the conventional techniques for sealing the OLED display is to use different types of epoxies, inorganic materials and/or organic materials that form the seal after they are cured by ultra-violet light. Vitex Systems manufactures and sells a coating under the brand name of Batrix™, which is a composite based approach where alternate layers of inorganic materials and organic materials can be used to seal the OLED display. Although these types of seals usually provide good mechanical strength, they can be very expensive and there are many instances in which they have failed to prevent the diffusion of oxygen and moisture into the OLED display. Another conventional technique for sealing the OLED display is to utilize metal welding or soldering; however, the resulting seal is not durable in a wide range of temperatures because of substantial differences between the coefficients of thermal expansions (CTEs) of the glass plates and metal in the OLED display.

Another technique for sealing a glass package (such as an OLED display) is disclosed in U.S. Pat. No. 6,998,776, assigned to Corning Incorporated, the entire disclosure of which is hereby incorporated by reference. The technique involves a laser frit sealing technology, which compared to the conventional epoxy sealing method, demonstrates many advantages, such as much higher hermeticity, a high display density with a fixed size of substrate, and application to top emission devices. However, the use of a high power laser to melt the frit materials may lead to one or more disadvantageous results. Indeed, it is possible that the thermal cycle caused by the heating process can cause thermal damage in OLED devices.

In the laser frit sealing technique, the frit is bonded to various device materials such as cathode metal-leads, indium tin oxide (ITO) and other protective materials. Each material on the device side has different thermal properties (e.g., CTE, heat capacity and thermal conductivity). The various thermal properties on the device side can cause a significant variation of the bonding strength between the frit and the device boundary after completing the laser sealing process. In addition, the cathode metal-leads can be delaminated after laser frit sealing. Since the cathode usually consists of multiple layers of two or three different metal elements, each with potentially different CTEs, the relatively fast process of heating and cooling employed in laser frit sealing can occasionally cause damage on the metal cathodes, such as "winkle" effects. The high thermal conductivity of metal leads is also a possible origin of lowering the bonding strength. This is due to the relatively fast heat dissipation during the process of heating the frit with a high power laser.

Accordingly, there are needs in the art to address the aforementioned problems and other shortcomings associated with known techniques of sealing glass packages, such as OLED displays.

SUMMARY OF THE INVENTION

In accordance with one or more embodiments of the invention, methods and apparatus provide for a hermetically sealed package, including: a first plate including inside and outside surfaces; a second plate including inside and outside surfaces; frit material disposed on the inside surface of the second plate; and at least one dielectric layer disposed directly or indirectly on at least one of: (i) the inside surface of the first plate at least opposite to the frit material, and (ii) the inside surface of the second plate at least directly or indirectly on the frit material. The frit material forms a hermetic seal against the dielectric layer in response to heating.

The package may further include one or more electronic components disposed on the inside surface of the first glass plate.

The dielectric layer may include silicon nitride. Alternatively, the dielectric layer may include a layer of silicon oxide over the silicon nitride. The dielectric layer may have a thickness of one of: between about 10 to 600 nm; between about 100 to 500 nm; and between about 10 to 50 nm. The layer of silicon oxide may have a thickness of about 10 nm and the layer of silicon nitride may have a thickness of about 400 nm.

At least one of the first and second plates may be formed from metals, alloys, ceramics, glasses, quartz, and/or polymers. Those skilled in the art will appreciate that the package (specifically a glass package) can be used for liquid crystal displays (LCDs), phosphor screens, solar cells, and any other electronic device that need to operate in an environmentally unfriendly atmosphere, and/or needs protection from corrosion, accidental damage, scratches, etc.

Other aspects, features, advantages, etc. will become apparent to one skilled in the art when the description of the invention herein is taken in conjunction with the accompanying drawings.

BRIEF DESCRIPTION OF THE DRAWINGS

For the purposes of illustrating the various aspects of the invention, wherein like numerals indicate like elements, there are shown in the drawings simplified forms that may be employed, it being understood, however, that the invention is not limited by or to the precise arrangements and instrumentalities shown, but rather only by the issued claims. The drawings may not be to scale, and the aspects of the drawings may not be to scale relative to each other. To assist those of ordinary skill in the relevant art in making and using the subject matter hereof, reference is made to the appended drawings and figures, wherein:

DETAILED DESCRIPTION OF THE PRESENT INVENTION

While the various embodiments of the present invention are generally directed to hermetically sealed packages. Although the package may be formed from at least one of metals, alloys, ceramics, glasses, quartz, and/or polymers, by way of example, the present invention will be discussed in the context of glass packages for sealing OLED displays.

Figure 1A:
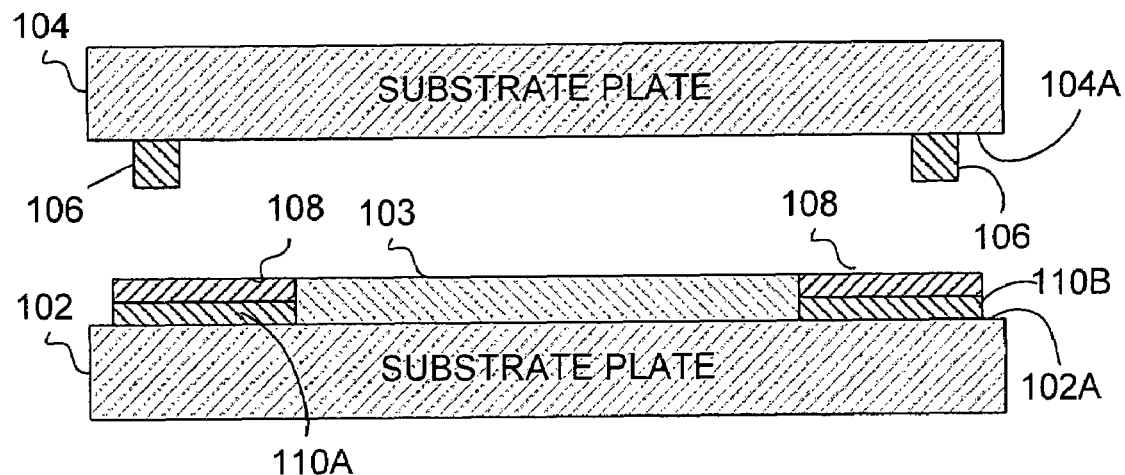
FIG. 1A is a cross-sectional, partially exploded view of a package that is to be sealed using a frit material in accordance with one or more aspects of the present invention.
Figure 1B:
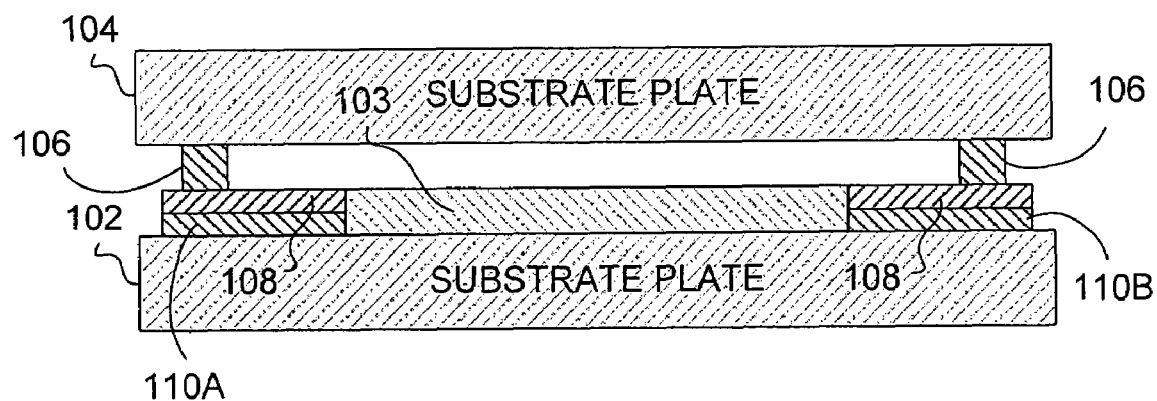
FIG. 1B is a cross-sectional view of the package of FIG. 1 after sealing.
Figure 2:
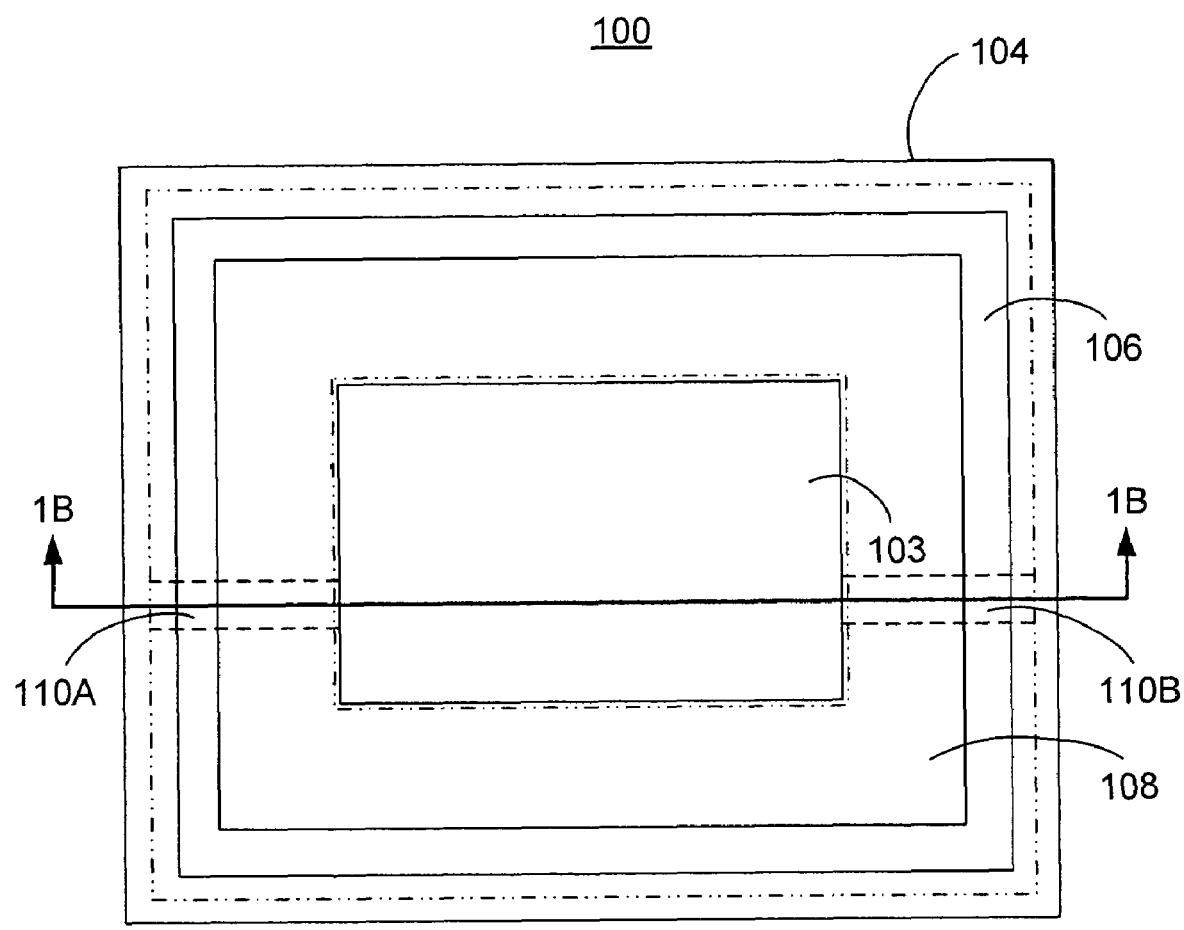
FIG. 2 is a top view of the package of FIG. 1B.
Figure 3:
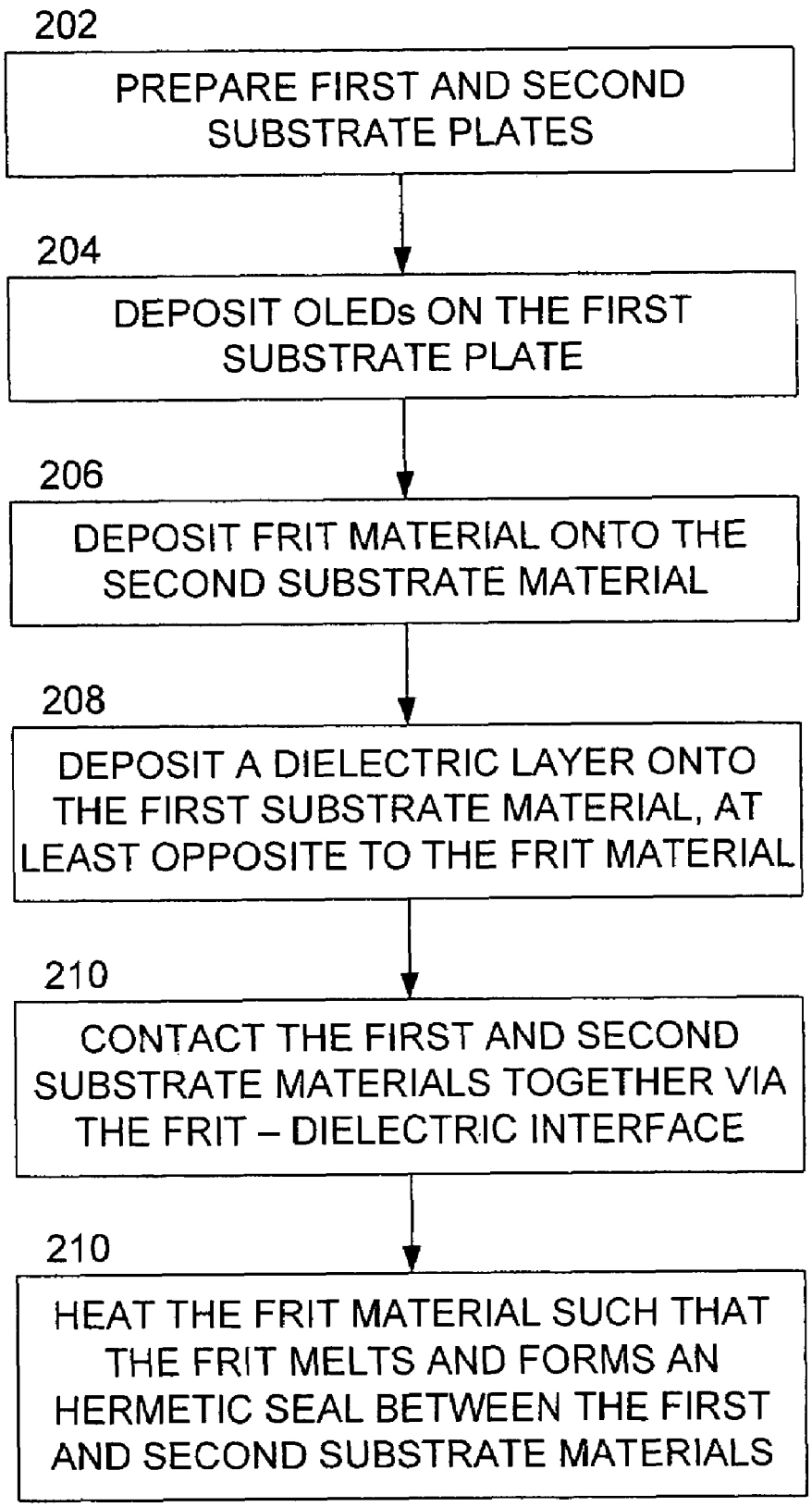
FIG. 3 is a flow diagram illustrating a process of sealing the package of FIG. 1B and/or other embodiments disclosed herein in accordance with one or more aspects of the present invention.

With reference to FIGS. 1-3, there are disclosed in accordance with one or more aspects of the present invention a glass package 100 and method for manufacturing same. The glass package 100 may be a hermetically sealed OLED display 100. FIG. 1A is a cross-sectional, partially exploded view of the glass package (or OLED display) 100, FIG. 1B is a cross-sectional view of the sealed glass package 100, and FIG. 2 is a top view thereof.

The OLED display 100 is a multilayer structure including a first substrate plate 102 and a second substrate plate 104, either or both of which may be glass sheets (action 202, FIG. 3). Again, in alternative embodiments, one or more of the substrate plates 102, 104 may be formed from metals, alloys, ceramics, quartz, and/or polymers. The first and second substrate plates 102, 104 may be transparent glass plates, such as those manufactured and sold by Corning Incorporated under the brand names of Code 1737 glass or Eagle 2000™ glass, or other companies, such as Asahi Glass Co. (e.g., OA10 glass and OA21 glass), Nippon Electric Glass Co., NHTechno and Samsung Corning Precision Glass Co.

The first and second substrate plates 102, 104 include respective inside and outside surfaces 102A, 102B. At least one device 103 (e.g., electronic devices, such as an array of OLEDs) that is to be hermetically sealed between the plates 102, 104 is disposed on the inside surface 102A of the first substrate plate 102 (action 204, FIG. 3). A typical OLED 103 includes an anode electrode (or lead) 110A, one or more organic layers, and a cathode electrode (or lead) 110B; however, it should be readily appreciated by those skilled in the art that any known OLED 103 or hereinafter developed OLED may be used in the glass package 100. Again, any other device may be employed in the glass package 100 without departing from the spirit and scope of the present invention.

A frit material 106 is disposed on the inside surface 104A of the second substrate plate 104 (action 206, FIG. 3). The frit 106 may advantageously be deposited along edges of the second substrate plate 104, e.g., approximately 1 mm away from free edges of the plate 104. The frit material may be dispensed at a width of about 0.3-3 mm (0.7-1.0 mm being preferred), and height of about 10-20 µm, 14-16 µm being preferred. In one or more embodiments, the frit 106 may be a low temperature glass frit that contains one or more absorbing ions chosen from the group including iron, copper, vanadium, and neodymium. The ions are selected to absorb energy (e.g., light energy or other radiation) at specific wavelengths (or ranges thereof) such that use of an energy source at such wavelength may be used to heat the frit 106. The frit 106 may also be doped with filler (e.g., inversion filler, additive filler, etc.) which lowers the coefficient of thermal expansion of the frit 106 so that it matches or substantially matches the coefficient(s) of thermal expansion of the two substrate plates 102 and 104. The compositions of several exemplary frit materials 106 may be found in U.S. Pat. No. 6,998,776.

Optionally, the frit 106 may be pre-sintered to the second substrate plate 104. To accomplish this, the frit 106 is deposited onto the second substrate plate 104 (action 206) and then heated so that it adheres to the second substrate plate 104. A more detailed discussion regarding the optional step of pre-sintering may be found in U.S. Pat. No. 6,998,776.

Figure 5:
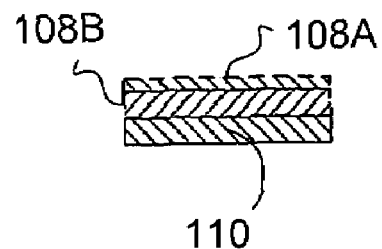
FIG. 5 is a cross-sectional view of the dielectric layer and lead in accordance with an alternative aspect of the present invention.

Next, a dielectric layer 108 is disposed directly or indirectly on the inside surface 102A of the first substrate plate 102 at least opposite to the frit material 106 (action 208, FIG. 3). The dielectric layer 108 acts as a passivation layer, which protects the components of the package 100, e.g., the OLED devices, from mechanical and chemical abuse and potential damage. As illustrated, the dielectric layer 108 is disposed on the leads 110. With reference to FIG. 5, the dielectric layer 108 may include a single layer of material, such as silicon nitride, or may be a multi-layer structure, such as a layer of silicon oxide 108B over an initial layer 108A (e.g., the silicon nitride).

The dielectric layer 108 may be deposited in any number of ways. For example, the dielectric layer 108 may be deposited only on the sealing boundary, opposite to the frit material 106 (as is depicted), such that the dielectric layer 108 does not cover the one or more devices 103. Alternatively, the dielectric layer 108 may be deposited also within the frit boundary such that the dielectric layer 108 at least partially covers the one or more devices 103. In the case of on OLED device 103, additional advantages may be obtained when the dielectric layer 108 at least partially covers at least one of the anode and cathode electrodes 110, as is illustrated.

The dielectric layer 108 layer may be deposited by any thin film deposition technique, such as sputtering, physical vapor deposition (PVD), chemical vapor deposition (CVD), or plasma-enhanced chemical vapor deposition (PECVD). The thickness of the dielectric layer 108 layer may be between about 10 to 600 nm. In one or more embodiments, it has been found that a thickness of about 10 to 50 nm may lead to better sealing. In accordance with other embodiments, the thickness of the dielectric layer 108 may be between about 100 to 500 nm. For example, when the dielectric layer 108 is a multi-layer structure, the layer of silicon oxide 108B may have a thickness of about 10-100 nm, and the layer of silicon nitride 108A may have a thickness of about 200-500 nm, where 400 nm is preferred. The coating uniformity of dielectric layer 108 can provide some compensation for height fluctuations in the frit material 106 which may improve hermetic sealing.

The compressive strength of the dielectric layer 108 may be a significant characteristic of the package 100, particularly when the dielectric layer 108 is formed of ceramic materials (such as the aforementioned SiNx/SiO). By way of example, the dielectric layer may exhibit a compressive stress of about 0.01-700 MPa, about 200-500 MPa, or preferably about 400-500 MPa. The material(s) used to form the dielectric layer 108, such as ceramic, may absorb large compressive stresses, but not necessarily tensile stresses. Thus, if there are any tensile stresses when the substrate plates 102, 104 heat (during the sealing process), which may result from a higher CTE of the substrate plates 102, 104 as compared with the frit 106 and/or the dielectric layer 108) the inherent compressive stress of the dielectric layer 108 will provide compensation by neutralizing the adverse effects of tensile stresses generated by expansion of the glass frit 106 and/or substrate plates 102, 104.

While the above discussion of the deposition of a multi-layer the dielectric layer 108 (e.g., silicon nitride plus silicon oxide) implies discrete layers 108A, 108B, alternative embodiments contemplate a gradient (gradual transition) in the interface of silicon nitride to silicon oxide. The gradient may be rapid or gradual, depending on the exigencies of the situation. The gradient may be achieved, for example, by changing the coating atmosphere gradually during deposition from $NH_3$ (nitrogen source) to $O_2$.

At action 210, the first and second substrate plates 102, 104 are brought together via the frit-to-dielectric interface. At action 212, the frit 106 is heated by an irradiation source (e.g., a laser, infrared lamp, etc.) such that the frit 106 forms a hermetic seal. The seal connects and bonds the first substrate plate 102 to the second substrate plate 104. The hermetic seal protects the OLEDs 103 (and/or other devices) by preventing oxygen and moisture in the ambient environment from entering into the package 100.

Due to the dielectric layer 108, the heat from the melting frit 106 transmits to a lesser degree to the device(s) 103, such as the metal electrodes 110. Thus, heat damage is expected to decrease significantly.

The dielectric layer 108 layer should have a very high melting point because it should exhibit thermal stability during the frit sealing process. As discussed above, the dielectric layer 108 layer may be formed from silicon nitride (SiNx) in the form of very thin film, where x may be about 0.1 to 3. The properties of silicon nitride include low density, high temperature strength, superior thermal shock resistance, excellent wear resistance, good fracture toughness, high mechanical fatigue and creep resistance, excellent oxidation and corrosion resistance, and high thermal conductivity compared to the glass (particularly, Eagle 2000™) on which the OLED devices 103 are disposed. The high thermal conductivity of the dielectric layer 108 (e.g., ceramic) compared to the frit 106 and substrate plates 102, 104 (e.g., glass) helps in the sealing process, because heat developed in the frit 106 does not concentrate in localized areas; rather, the heat dissipates via the higher conductivity in other areas. Concentrated heat (without good dissipation), which occurs in materials of low thermal conductivity, may result in melted or otherwise damaged leads 110 and/or other critical components. Another advantage of using silicon nitride as the dielectric layer 108 is the resultant compensation in the differences in the CTEs of the frit 106 and the substrate plates 102, 104. The CTE of SiNx falls in the range of about 3 to $4\times10^{-6}$/° C. This buffers the significant differences of the CTEs of the frit 106 and the substrate plates 102, 104, such as glass, and avoids cracking and/or delamination of the seal.

It is noted that CTE mismatches between the substrate plates 102, 104 and the other components, such as the frit material and the dielectric 108. Such considerations are complicated by use of specific materials for the substrate plates 102, 104, such as metals, alloys, glass, ceramics, quartz, and/or polymers.

The layer of dielectric material on the device side can provide very uniform thermal properties as a counter to the frit materials during the laser sealing process. The dielectric layer may prevent corrosion of the electrical lead materials on the OLED device prior to sealing. Since the counter-part frit material is a single material (the dielectric), material compatibility between the frit and the dielectric layer can be improved and potentially optimized. With the dielectric material on the OLED device side, the laser sealing process complexity (due to variations in customer materials) can be greatly reduced. The thin dielectric layer protects electrical leads from thermal damage during the laser sealing process.

The thin dielectric layer also exhibits another advantage when it does not absorb light (e.g., laser light or other irradiation) at the wavelength used for sealing the glass package by heating the frit material. In this way, the dielectric material does not interfere with melting the frit material as it does not lower the efficient transfer of laser energy to the frit material. By way of example, some frit material may be heated using laser light at a wavelength of about 810 nm. Thus, advantages are obtained when the dielectric material does not absorb light energy at 810 nm.

As the thin layer provides a buffer between the frit material and the device, some frit thickness fluctuation can be compensated for. Deposition of low dielectric materials is easily implemented at the end of OLED manufacturing processes because an additional thin film deposition system is not required.

Figure 4:
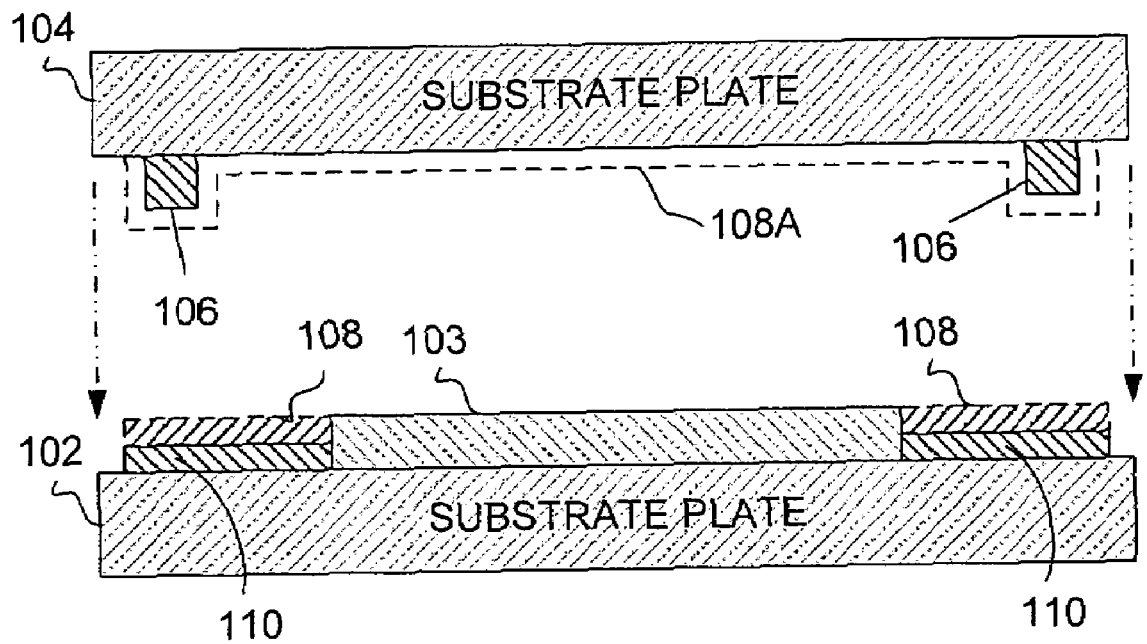
FIG. 4 is a cross-sectional, partially exploded view of a package that is to be sealed using a frit material in accordance with one or more alternative aspects of the present invention.

Reference is now made to FIG. 4, which a side view illustrating alternative features of a glass package 100A, which again may be a hermetically sealed OLED display. As common numerals indicate like elements in comparison with FIGS. 1-3, a recitation of already discussed elements will not be repeated. The package 100A may include a dielectric layer 108A directly and/or indirectly disposed on the internal surface of the second substrate plate 104. The dielectric layer 108A may be deposited only on the sealing boundary, covering the frit material 106 and directly only a portion (or none) of the second substrate plate. Alternatively, the dielectric layer 108A may be deposited (as is depicted) on the frit material 106 and also directly (or indirectly) on the inside surface of the second substrate plate 104.

The above features result in further design alternatives. Specifically, the dielectric layers 108 and 108A may be used in combination, or either layer 108, 108A may be used alone.

EXPERIMENTS

A number of structures were prepared using the techniques described above. For example, one such structure included a 400 nm $SiN_x$ dielectric layer over an OLED array, with an overcoat of 10 nm $SiO_x$. The dielectric layer was deposited such that it exhibited 493 MPa of compressive residual stress after annealing at 400° C. The dielectric layer (SiNx+SiOx)

was coated on half of the backplane architecture of an OLED array, including all electrical leads. Thereafter, the structure was placed an 85/85 humidity chamber. After about 73 hours of exposure, an examination of the structure revealed a combined advantage: (i) the dielectric prevented corrosion of the backplane architecture and did not absorb light energy intended for heating the frit material. Specifically, the region which did not have the dielectric layer corroded extensively whereas the other half coated with the dielectric remained intact and did not show any sign of corrosion. Monitoring of the delivery of laser energy at 810 nm to the frit material revealed that there was very little absorption in the dielectric layer.

Although the sealing process and apparatus of the various embodiments of the present invention were described above in the context of a hermetically sealed OLED display 100, it should be understood that the same or similar sealing process can be used in other applications where two glass plates need to be sealed to one another. Accordingly, the present invention should not be construed in a limited manner.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A hermetically sealed package, comprising:
a first plate including inside and outside surfaces;
one or more electronic components, including anode and cathode electrodes, disposed on the inside surface of the first plate;
a second plate including inside and outside surfaces;
frit material disposed on the inside surface of the second plate; and
at least one dielectric layer disposed directly or indirectly on at least one of: (i) the inside surface of the first plate at least opposite to the frit material, and (ii) the inside surface of the second plate at least directly or indirectly on the frit material, with the at least one dielectric layer at least partially covering at least one of the anode and cathode electrodes;
wherein the frit material forms a hermetic seal against the dielectric layer in response to heating.

2. The package of claim 1, wherein at least one of the first and second plates are formed from a material selected from the group consisting of metals, alloys, ceramics, glasses, quartz, and polymers.

3. The package of claim 1, wherein the dielectric layer includes silicon nitride.

4. The package of claim 3, wherein the dielectric layer has a thickness of one of: between about 10 to 600 nm; between about 100 to 500 nm; between about 200-500 nm, between about 10 to 50 nm, and about 400 nm.

5. The package of claim 3, wherein the dielectric layer includes a layer of silicon oxide over the silicon nitride.

6. The package of claim 5, wherein:
the layer of silicon oxide has a thickness of about 10-100 nm; and
the layer of silicon nitride has a thickness of one of: between about 10 to 500 nm; between about 100 to 500 nm; between about 200-500 nm, between about 10 to 50 nm, and about 400 nm.

7. The package of claim 1, wherein the dielectric layer exhibits a compressive stress of one of: about 0.01-700 MPa, about 200-500 MPa, about 400-500 MPa, and about 500 MPa.

8. The package of claim 1, wherein one of:
the at least one dielectric layer does not cover the one or more electronic components; and
the at least one dielectric layer covers the one or more electronic components, thereby reducing corrosion thereof.

9. The package of claim 1, wherein the one or more electronic components includes one or more organic light emitting devices (OLEDs).

10. The package of claim 1, wherein at least one of:
the dielectric layer covers the frit material and directly covers at least a portion of the inside surface of the second plate;
the dielectric layer covers the frit material and directly covers substantially all of the inside surface of the second plate;
the dielectric layer covers the frit material and does not covers substantial portions of the inside surface of the second plate.

11. The package of claim 1, wherein one of:
the at least one dielectric layer is disposed directly or indirectly on the inside surfaces of both the first and second plates; and
the at least one dielectric layer is disposed directly or indirectly on the inside surface of one of the first and second plates.

12. A hermetically sealed package, comprising:
a first plate including inside and outside surfaces;
one or more electronic components disposed on the inside surface of the first plate;
a second plate including inside and outside surfaces;
frit material disposed on the inside surface of the second plate;
at least one dielectric layer disposed directly or indirectly on at least one of: (i) the inside surface of the first plate at least opposite to the frit material, and (ii) the inside surface of the second plate at least directly or indirectly on the frit material, wherein the dielectric layer is formed of a layer of silicon nitride and a layer of silicon oxide on the layer of silicon nitride, with the silicon nitride layer gradually transitioning into the silicon oxide layer at the interface between the silicon nitride layer and the silicon oxide layer; and
wherein the frit material forms a hermetic seal against the dielectric layer.

13. The package of claim 12, wherein one of:
the at least one dielectric layer does not cover the one or more electronic components; and
the at least one dielectric layer covers the one or more electronic components, thereby reducing corrosion thereof.

14. The package of claim 12, wherein the one or more electronic components includes one or more organic light emitting devices (OLEDs).

15. The package of claim 14, wherein:
the one or more OLEDs include anode and cathode electrodes; and
the at least one dielectric layer at least partially covers at least one of the anode and cathode electrodes.

16. The package of claim 12, wherein at least one of:
the dielectric layer covers the frit material and directly covers at least a portion of the inside surface of the second plate;

the dielectric layer covers the frit material and directly covers substantially all of the inside surface of the second plate; the dielectric layer covers the frit material and does not cover substantial portions of the inside surface of the second plate.

17. The package of claim 12, wherein at least one of the first and second plates are formed of glass.

18. An organic light emitting device (OLED), comprising:

first and second glass plates, each including respective inside and outside surfaces;

one or more OLEDs, including anode and cathode electrodes, disposed on the inside surface of the first glass plate;

frit material disposed on the inside surface of the second glass plate; and at least one dielectric layer disposed directly or indirectly on at least one of: (i) the inside surface of the first glass plate at least opposite to the frit material, and (ii) the inside surface of the second glass plate at least directly or indirectly on the frit material, with the dielectric layer at least partially covering at least one of the anode and cathode electrodes;

wherein the frit material forms a hermetic seal against the dielectric layer.

19. The package of claim 18, wherein at least one of the first and second plates are formed of glass.

* * * * *